United States Patent [19]

Davidheiser

[11] 4,276,521

[45] Jun. 30, 1981

[54] QUADRIPHASE INTEGRATED HIGH-SPEED MICROWAVE MODULATOR

[75] Inventor: Roger A. Davidheiser, Manhattan Beach, Calif.

[73] Assignee: TRW Inc., Redondo Beach, Calif.

[21] Appl. No.: 970,606

[22] Filed: Dec. 18, 1978

[51] Int. Cl.³ .......................... H03C 3/00; H01P 3/08
[52] U.S. Cl. .............................. 332/23 R; 332/29 R; 333/104; 333/128; 333/164
[58] Field of Search ............ 332/9 R, 16 R, 21, 23 R, 332/24, 29 R; 325/125, 126, 145, 446; 333/103, 104, 238, 246, 116, 164, 128, 134, 136

[56] References Cited

U.S. PATENT DOCUMENTS

| | | | |
|---|---|---|---|
| 3,678,395 | 7/1972 | Hunton et al. | 333/238 |
| 3,967,217 | 6/1976 | Solomon | 332/16 R X |
| 4,118,670 | 10/1978 | Dickens | 333/246 X |
| 4,168,479 | 9/1979 | Rubin | 333/128 X |

FOREIGN PATENT DOCUMENTS 580603  11/1977  U.S.S.R. ............................... 332/16 R

OTHER PUBLICATIONS

Sarbacher, "Encyclopedic Dictionary of Electronics and Nuclear Engineering," Prentice-Hall, Inc., 1959; pp. 782–783.

*Primary Examiner*—Siegfried H. Grimm
*Assistant Examiner*—Edward P. Westin
*Attorney, Agent, or Firm*—John J. Connors; Andra M. Finkel

[57] ABSTRACT

A quadriphase modulator, designed in a planar metal geometry for operation in the microwave frequency range, uses Schottky barrier diodes as the switching elements, and is capable of operating at bit data rates up to 15% of the carrier frequency. The microwave circuit employs a microstrip power splitter that couples the carrier signal to two biphase modulators while providing DC isolation. Each biphase modulator includes coplanar-to-slot transmission line transition, with a pair of diodes controlling the phase shift across the transition. The diodes are connected in reverse polarity and the bias for switching the diodes is controlled by the modulating signal. The slot lines from the two biphase modulators are coupled through a microstrip transition and through a Lange 90 degree hybrid to the output load.

4 Claims, 5 Drawing Figures

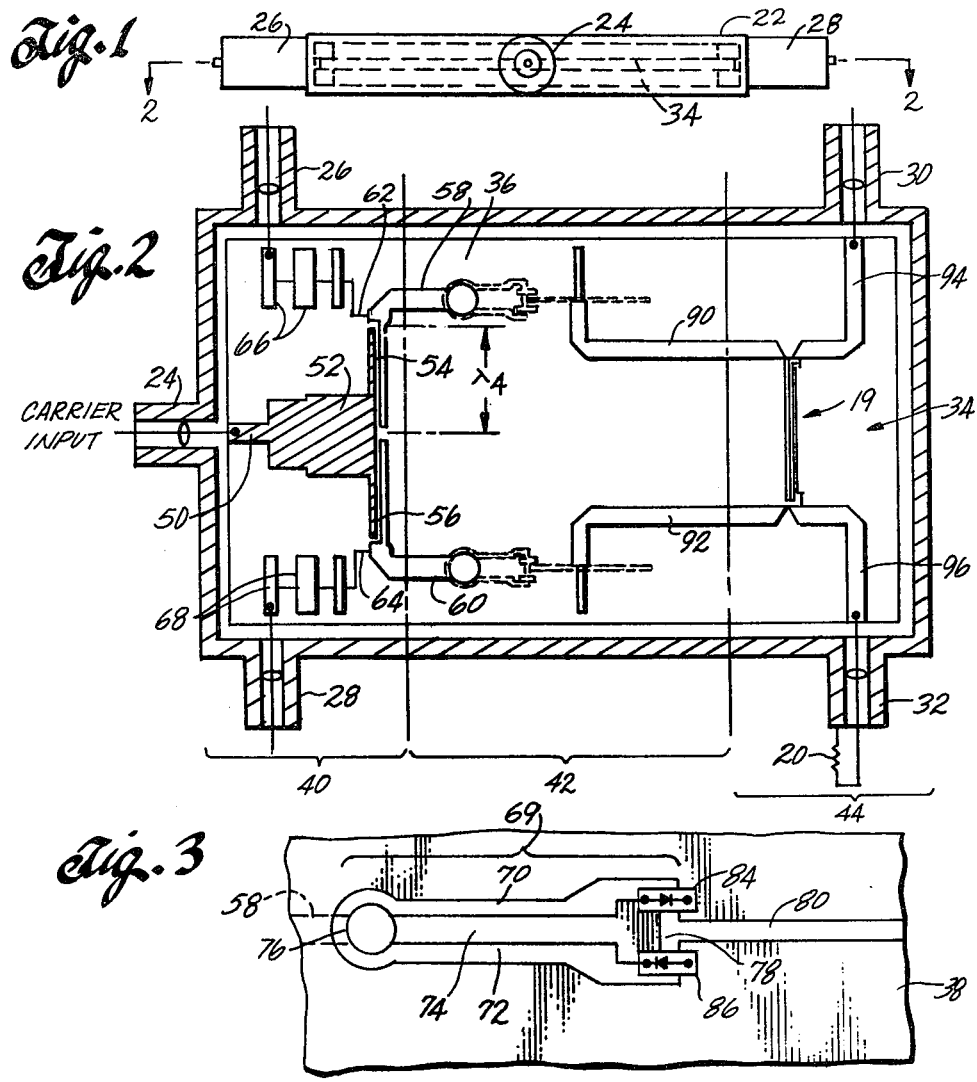

QUADRIPHASE INTEGRATED HIGH-SPEED MICROWAVE MODULATOR

FIELD OF THE INVENTION

This invention relates to printed circuit type microwave circuits, and more particularly, is concerned with a digital quadriphase modulator useful for carrier frequencies between 4 and 40 GHz and for data rates to 15% of that frequency.

BACKGROUND OF THE INVENTION

High-speed digital phase switches for microwave signals have taken a variety of forms. One type of switch changes phase by changing the path length either by removing or including a segment of a transmission line, as by means of a variable resistance. A second type of modulator utilizes a diode bridge which switches current paths at a transformer input. A third type of modulator utilizes dual gate FET switches which pass or block current to alter current paths. Path length modulators do not produce a biphase output if switching elements, such as diodes, are used which have substantial parallel capacitance or series resistance. The presence of series resistance results in an amplitude difference between the transmitted and reflected signals producing the two output states. Because the output phase is affected by the switches' parallel capacitance, it is necessary to use switch elements having a low parallel capacitance such as PIN diode devices. However, the voltage switching time of such diode devices is long. Other types of current path switching circuits experience difficulty at higher frequencies where current routing schemes introduce phase and amplitude shifts.

SUMMARY OF THE INVENTION

The present invention is directed to a quadriphase modulator using a pair of biphase switches each formed by a transition between a coplanar transmission line and a slot transmission line. A pair of reversed polarity Schottky barrier diodes switch microwave current guided by a section of the coplanar line between the two sides of the slot transmission line. Since the switch is symmetrical, the Schottky diodes provide the desired output if they are matched or if the difference in their parallel capacitance and series resistance are insignificant in the circuit. Voltage switching characteristics of a Schottky diode are very fast. The ability of the Schottky diode to switch symmetrically as well as rapidly in the coplanar to slot line transition is of importance to achieving high data rate digital communications.

In brief, the quadriphase modulator of the present invention is constructed by printed circuit techniques using a single sheet of dielectric with conductive patterns formed on the two surfaces of the dielectric sheet. One surface has a conductive layer forming a ground plane extending over the full surface. A microwave carrier input signal is applied to an input microstrip transmission line formed by the ground plane and a conductive strip on the opposite surface of the dielectric. The microstrip transmission line branches into two parallel microstrip conductors through an inphase power splitter which provides DC isolation of the two parallel conductors from the input line. The digital modulating input signal is connected between the ground plane and each of said parallel conductors through low pass filter sections. A pair of biphase switches are formed by two parallel patterns of nonconductive paths formed in the ground plane. Each pattern includes an elongated closed loop nonconductive path forming an elongated center conductor that is DC isolated from the ground plane and forms a coplanar transmission line with the ground plane. The elongated conductors from the power splitter are conductively joined through the dielectric to said parallel microstrip conductors on the opposite surface. Each biphase switch pattern further includes an elongated slot intersecting the closed loop path adjacent one end of the elongated conductor. A pair of Schottky diodes connect the end of the elongated conductor in each pattern to the ground plane on either side of the intersecting slot forming the slot transmission line. The diodes are connected in reverse polarity and alternately biased conductive by the modulating signal to short the center conductor alternately to one side or the other of the slot transmission at the modulating frequency, causing a 180 degree phase reversal in the electric field of the slot transmission line with polarity reversal of the modulating signal. The signals from the two slot lines are combined by and coupled through a Lange 90 degree hybrid to an output load.

BRIEF DESCRIPTION OF THE DRAWINGS

For a more complete understanding of the invention reference should be made to the accompanying drawing, wherein:

FIG. 1 is an end view of the quadriphase modulator assembly;

FIG. 2 is a sectional view taken substantially on the line 2—2 showing one side of the printed circuit board forming the quadriphase modulator;

FIG. 3 is a detailed plan view of a portion of the ground plane side of the circuit board;

DETAILED DESCRIPTION

Figure 4:
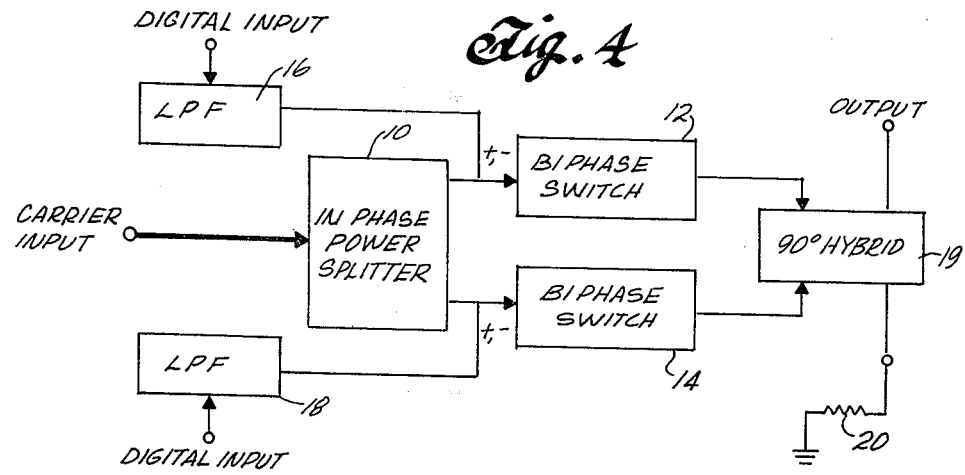
FIG. 4 is a schematic block diagram of the quadriphase circuit.

Referring to the block diagram of FIG. 4, the circuit elements of the quadriphase modulator are shown in block form. The carrier input signal is applied to an inphase power splitter 10. The power splitter matches two output transmission lines to the input carrier source and at the same time provides DC isolation. The two outputs are connected to two biphase switch elements 12 and 14. The biphase switch elements are controlled by modulating digital input signals connected respectively to the two switches through low-pass filters 16 and 18 which reject the carrier signal while passing the lower frequency components of the digital input signal.

Each biphase switch 12 switches the phase of the carrier signal by 180 degrees with each change in polarity of the digital input signal. Thus each biphase switch element modulates the phase of the carrier input at the bit rate of the digital input signal.

The two modulated carrier output signals from the biphase switch elements are connected to the two inputs of a Lange 90 degree combining hybrid 19, one output of which is connected to a non-reflective dummy load 20 while the other output provides the desired quadriphase modulated carrier output signal. The Lange hybrid is described in the article "Interdigitated Stripline Quadrature Hybrid" IEEE-MTT 17. If both digital inputs are positive, the output is in phase with the carrier input. If both digital inputs are negative, the output is 180 degrees out of phase. If one digital input is positive and the other is negative, the output is 90 degrees or 270 degrees out of phase, respectively, with the carrier input.

Details of the construction of the quadriphase modulator circuit are shown in FIGS. 1-3. The circuit includes an outer metal housing, indicated generally at 22, having five coaxial connectors positioned along the edges of the housing as indicated at 24 at the center of one end of the housing, at 26 and 28 adjacent one end of the housing, and at 30 and 32 adjacent the other end of the housing. The carrier input signal is coupled through the input coaxial connector 24 while the two digital input signals are coupled respectively through the coaxial connectors 26 and 28. The output is coupled to the output coaxial connector 30 while the dummy load is connected to the coaxial connector 32. As an alternative embodiment, the dummy load may be a thin film resistor followed by a ¼ metal strip painted on the substrate surface.

Internally of the housing 22, the center conductors of each of the coaxial connectors are connected to terminals on one side of a printed circuit board, indicated generally at 34. The printed circuit board consists of a substantially rectangular sheet of dielectric material having a top surface 36 on which is formed a pattern of conductors that are shaped to provide the functions of all of the circuit elements, except the biphase switches 12 and 14, described above in connection with FIG. 4. The top surface is shown in FIG. 2. The opposite surface of the printed circuit board 34 is completely covered with a conductive layer forming a ground plane 38 which is in electrical contact with the metal housing 22 and the outer conductors of the coaxial connectors. The ground plane, as hereinafter described, is provided with a pattern of nonconductive paths which form circuit elements that provide the function of the biphase switch elements 12 and 14 of FIG. 4. The bottom surface is shown in FIG. 3 and is substantially parallel to the surface 36. Functionally, the circuit board can be divided into three sections. A left-hand section 40 includes the circuit elements forming the inphase power splitter 10 and the low pass filters 16 and 18. A center section 42 includes the circuit elements forming the biphase switches 12 and 14. A right-hand section 44 includes the circuit element forming the Lange 90 degree hybrid 19.

Considering the power splitter section 40 of the printed circuit, the carrier input from the coaxial input connector 24 is connected to a microstrip line formed by the ground plane 38 and a conductive strip 50. The microstrip line has a characteristic input impedance of 50 ohms. A low impedance section of microstrip formed by widening the conductive strip 50 transforms the 50 ohm input impedance to half of this value and drives two narrow coupled line sections 54 and 56 which are approximately a quarter wave length in length and provide DC isolation. The parallel coupled line sections 54 and 56 in turn are each loaded with a 50 ohm microstrip line formed by the ground plane and conductors, indicated at 58 and 60, respectively.

The DC isolation of the power splitter 10 permits the modulating signals to be connected to the microstrip lines 58 and 60 through bias tees 62 and 64 which consist of conductive strips connecting the terminal connections of the coaxial connectors 26 and 28 to the microwave strip lines 58 and 60. A low pass filter is formed by a group of spaced pads 66 and 68, respectively, which are dimensioned to reject the 15 GHz carrier signal while passing the modulating signal whose frequency is anywhere between DC and 10 GHz.

Each microstrip line 58 and 60 is connected to an associated one of the biphase switch elements 12 and 14 which are formed on the ground plane side of the printed circuit board 34. Referring to FIG. 3 showing the ground plane side of the circuit board, each biphase switch consists of a section of coplanar transmission line 69 and a transmission line formed by a single slot 80 in the ground plane. The section of coplanar transmission line is formed by a pair of spaced parallel elongated slots or gaps 70 and 72 formed in the conductive ground plane 38, leaving an elongated center conductor 74. The center conductor 74 of the coplanar transmission line is isolated at either end from the ground plane by gaps 76 and 78 joining the ends of the gaps 70 and 72. The slot line formed by the single slot 80 is in alignment with the conductor 74 and intersects the cross gap 78. The coplanar transmission line of each biphase switch is coupled to an associated one of the strip lines 58 and 60 by positioning the coplanar line such that the end of the conductor 74 overlaps the strip line. A hole 82 through the substrate at the point of overlap is plated to form a DC connection between the strip line and the center conductor of the coplanar line.

Figure 5:
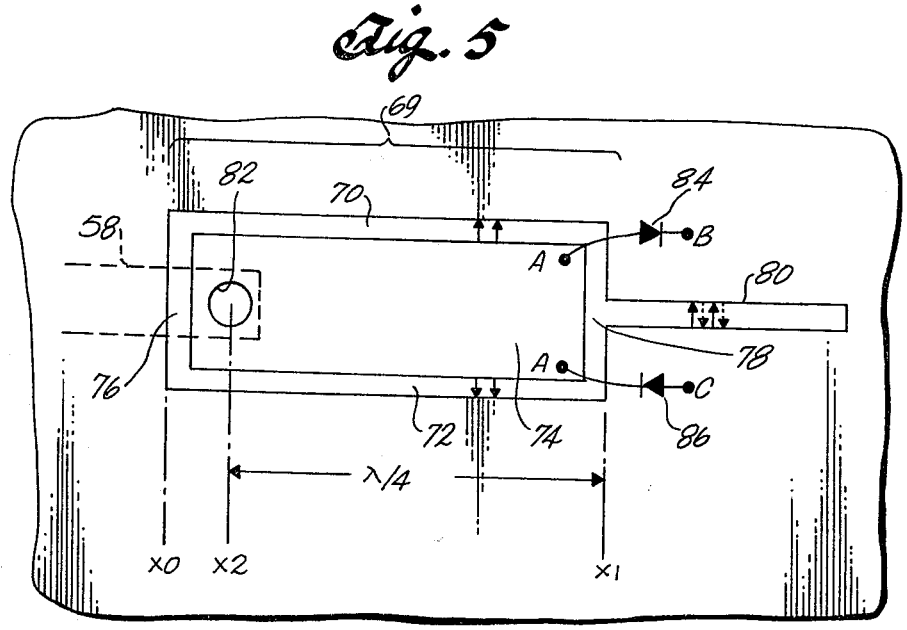
FIG. 5 is a simplified showing of the biphase switch.

The coplanar transmission line 69 supports a symmetric electromagnetic wave, that is, an even mode of transmission with an electric field extending across the two gaps 70 and 72 in opposite phase, as shown by the solid arrows in the simplified view of the biphase switch in FIG. 5. The coplanar transmission line can also propagate in a second mode which is antisymmetric (odd mode) about the axis of the line. However, this mode is short-circuited by the ground plane to the left of the gap 76 at $x_o$, exciting a standing wave in the odd mode. It is possible to short-circuit the coplanar odd mode without substantially affecting the even mode. This is accomplished by connecting the ground planes on either side of the coplanar line to each other, as provided by the single ground plane to the left of the gap 76, and then providing a transition at $x_2$ coupled only to the even mode. This transition provides satisfactory power transmission from DC up to a critical frequency whose associated quarter wave length becomes comparable to the hole size.

It is now possible to place a short from point A to point B across the transition to the slot line 80. It can be shown that if a quarter wavelength of coplanar line is placed between the slot line and the microstrip, that is, the distance between $x_1$ and $x_2 = \eta/4$, no power is reflected in the transition through the coplanar line. Because of symmetry, alternatively a short can be connected between points A and C with no power being reflected. The only change is that the phase of the transverse electric field propagated by the slot line is reversed, as indicated respectively by the solid arrows and the dotted arrows showing the electric field vector in the slot line. It has been found that with a short connecting either points A and B or points A and C, a standing wave ratio of less than 1.5 to 1 is achieved over a 15% bandwidth. It should be noted, however, that the electric field across the lower slot 72 of the coplanar line is twice that induced by the even coplanar mode carrying the same power. Thus the impedance at the coplanar slot line interface is nearly four times that of the coplanar line's characteristic impedance. The slot line load must equal this high impedance or the transition's bandwidth is reduced and a low Q resonance is observed, although total power transmission is still observed at the center frequency.

It will be seen that the coplanar line to slot line transition can be operated as a biphase switch by switching the short-circuit from either A to B or A to C. Switching is accomplished by connecting a pair of Schottky diodes 84 and 86 across the gap 78, respectively, between points A and B and points A and C. The diodes are connected in reverse polarity so that by changing the bias voltage at point A to either plus or minus with respect to the ground plane at points B and C, one or the other of the diodes will be forward biased to form a low impedance. Thus the modulating signal connected through the tees 62 and 64 operates to alternately switch the diodes 84 and 86 so as to reverse the phase of the carrier signal on the slot line 80 with each polarity change of the modulating signal. Since the switch is symmetric, the Schottky barrier diodes provide the desired output if they are matched or if the difference in their parallel capitance and series resistance is insignificant. Schottky diodes have the capability of extremely fast switching rates.

The slot lines 80 of the two biphase switches 12 and 14 are respectively coupled to microstrip lines formed by conductors 90 and 92, respectively. The transition is formed by a section of microstrip line crossing the slot line and terminating the microstrip in an open circuit a quarter wavelength from the crossing point and terminating the slot in a short circuit a distance 0.85 of a quarter wavelength from the microstrip. This transition provides a VSWR of less than 1.4 to 1 over almost an octave bandwidth.

The microstrip lines 90 and 92 are connected to a 90 degree combining hybrid, one output of which is connected through a microstrip line formed by a conductor 94 to the terminal connection with the coaxial output 30. The other output of the hybrid is connected through a microstrip formed by a conductor 96 to the nonreflective load 20 through the coaxial connector 32. The hybrid is described in detail in the article "Interdigitated Stripline Quadrature Hybrid, " by J. Lange, IEEE-MTT 17, pages 1150–1151 (December 1969). The effect of the 90 degree hybrid is to provide a microwave output in which the relative static output phase is 0, 90 degrees, 180 degrees or 270 degrees, depending upon the polarities of the two modulating input signals.

From the above description it will be seen that an improved microwave modulator is provided which is particularly useful in transmitting digital information. Data rates up to 15% of that of the carrier frequency are possible. The microwave transition which forms the biphase switch has uses apart from the quadriphase modulator. The modulator also performs as an analog phase shifter when the biphase switches are driven sinusoidally and 90 degrees out of phase. The entire modulator circuit is incorporated with a single substrate that, for operation at a nominal carrier frequency of 15 GHz, is only 0.8" by 0.35" in size and weighs only a fraction of a gram. The circuit's ease of fabrication and alignment allow use in low-cost, high-data rate communication systems.

What is claimed is:

1. A quadriphase modulator comprising: a dielectric substrate having a conductive layer on one surface forming a ground plane; an inphase power splitter circuit including a first conductor on the opposite surface from the ground plane, second and third parallel conductors, a pair of quarter wavelength coupled lines extending transverse to one end of said first conductor and the ends of the second and third conductors, each line including a first conductive strip joined to the first conductor and second and third parallel conductive strips joined to respective ones of the second and third conductors; a pair of biphase switch elements, each element including a coplanar transmission line section formed by an elongated closed loop nonconductive path surrounding an elongated center conductive strip formed in the ground plane and a slot line section formed by an elongated slot in the ground plane intersecting the closed loop path at one end of the center conductive strip, the center conductive strip of each biphase switching element overlapping end portions respectively of the second and third conductors of the power splitter circuit, the overlapping portions being connected electrically through the dielectric substrate, and a pair of diodes connected respectively between the center conductive strip and the ground plane on either side of the slot at the intersection between the slot and the closed loop nonconductive path; a microstrip 90 degree hybrid junction formed on the opposite side of the substrate from the ground plane; transition means coupling the slot line of each of the biphase switch elements to the hybrid circuit; means connecting a modulating reversible polarity bias voltage between the ground plane and said second and third conductors respectively for switching the bias across said diodes; and means for applying a carrier signal from said opposite surface to said pair of biphase switch elements.

2. Apparatus of claim 1 wherein said transition means between the slot lines in the ground plane of the two biphase switch elements and the microstrip hybrid junction includes microstrip lines having fourth and fifth conductors on the side of the substrate opposite the ground plane, the fourth and fifth conductors extending perpendicular to the respective slot lines in overlapping relationship.

3. An inphase power splitter circuit comprising: a dielectric substrate having a conductive layer on one surface forming a ground plane, a first conductor on the opposite surface from the ground plane, second and third parallel conductors, a pair of quarter wavelength coupled lines extending transverse to one end of said first conductor and the ends of the second and third conductors, each line including a first conductive strip joined to the first conductor and second and third parallel conductive strips joined to respective ones of the second and third conductors, the parallel strips providing DC isolation between the first conductor and the second and third conductors, respectively.

4. The power splitter of claim 3 wherein the first conductor and the second and third conductors form microstrip transmission lines with the ground plane having the same characteristic impedance, the first conductor being widened adjacent the intersection with the two quarter wavelength coupled lines to transform the impedance to half the value of said microstrip transmission lines.

* * * * *